US007968976B2

(12) United States Patent
Chang et al.

(10) Patent No.: US 7,968,976 B2
(45) Date of Patent: Jun. 28, 2011

(54) GUARD RING EXTENSION TO PREVENT RELIABILITY FAILURES

(75) Inventors: Nicole Meier Chang, Mountain View, CA (US); George J. Korsh, Redwood City, CA (US); Shafqat Ahmed, San Jose, CA (US); John M. Nugent, Santa Clara, CA (US); Ed Nabighian, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/727,010

(22) Filed: Mar. 18, 2010

(65) Prior Publication Data

US 2010/0187528 A1 Jul. 29, 2010

Related U.S. Application Data

(60) Continuation of application No. 12/425,708, filed on Apr. 17, 2009, which is a division of application No. 11/648,250, filed on Dec. 29, 2006, now Pat. No. 7,566,915.

(51) Int. Cl.
*H01L 23/58* (2006.01)

(52) U.S. Cl. ........ 257/626; 257/127; 257/170; 257/409; 257/484; 257/620; 257/E23.002; 257/E29.013

(58) Field of Classification Search .................. 257/127, 257/170, 409, 484, 620, 626, E23.002, E29.013
See application file for complete search history.

(56) References Cited

U.S. PATENT DOCUMENTS

| 6,046,101 | A * | 4/2000 | Dass et al. ............... 438/624 |
| 6,352,940 | B1 * | 3/2002 | Seshan et al. ............ 438/762 |
| 6,753,608 | B2 * | 6/2004 | Tomita .................... 257/758 |
| 7,394,158 | B2 * | 7/2008 | Carta et al. ............... 257/762 |
| 7,566,915 | B2 * | 7/2009 | Chang et al. ............. 257/127 |
| 2004/0026785 | A1 * | 2/2004 | Tomita .................... 257/758 |
| 2004/0147097 | A1 | 7/2004 | Pozder et al. |
| 2006/0086939 | A1 * | 4/2006 | Carta et al. ................ 257/77 |
| 2006/0133552 | A1 | 6/2006 | Subramanian |
| 2008/0157284 | A1 * | 7/2008 | Chang et al. ............. 257/620 |
| 2008/0286968 | A1 * | 11/2008 | Carta et al. ............... 438/686 |
| 2009/0200548 | A1 * | 8/2009 | Chang et al. ............... 257/48 |
| 2010/0187528 | A1 * | 7/2010 | Chang et al. ............... 257/48 |
| 2010/0197114 | A1 * | 8/2010 | Jeng et al. ............... 438/460 |

* cited by examiner

Primary Examiner — Mary Wilczewski
(74) Attorney, Agent, or Firm — Rahul D. Engineer (57) ABSTRACT

An embodiment of the present invention is a technique to prevent reliability failures in semiconductor devices. A trench is patterned in a polyimide layer over a guard ring having a top metal layer. A passivation layer is etched at bottom of the trench. A capping layer is deposited on the trench over the etched passivation layer. The capping layer and the top metal layer form a mechanical strong interface to prevent a crack propagation.

4 Claims, 9 Drawing Sheets

GUARD RING EXTENSION TO PREVENT RELIABILITY FAILURES

CROSS REFERENCE TO RELATED APPLICATIONS

The present application is a continuation of U.S. patent application Ser. No. 12/425,708, entitled "GUARD RING EXTENSION TO PREVENT RELIABILITY FAILURES" filed on Apr. 17, 2009, which is the divisional of U.S. Pat. No. 7,566,915 entitled "GUARD RING EXTENSION TO PREVENT RELIABILITY FAILURES" Issued on Jul. 28, 2009.

BACKGROUND

1. Field of the Invention

Embodiments of the invention relate to the field of semiconductor, and more specifically, to semiconductor fabrication.

2. Description of Related Art

During the fabrication process of semiconductor devices, the active dice are subject to a number of mechanical and thermal stresses that may cause failures. For example, in the wafer dicing and accelerated test phases, the saw-induced or thermo-mechanical stress-induced cracks may propagate into the active circuitry and cause reliability failures under temperature and/or humidity exposure.

Existing techniques to avoid these reliability failures have a number of drawbacks. Typical techniques use a metal guard ring together with a nitride passivation on top of the metallization stack to create a hermetic seal around the active die. The hermetic seal is intended to prevent cracks from propagating into the active circuitry. However, these designs have been shown inadequate. Cracks have been observed propagating over the top metal layer of the guard ring. As a result, the hermetic seal is breached and moisture is able to penetrate into the die. Corrosion and/or metal migration eventually lead to failures during accelerated reliability testing.

BRIEF DESCRIPTION OF THE DRAWINGS

Embodiments of invention may best be understood by referring to the following description and accompanying drawings that are used to illustrate embodiments of the invention. In the drawings.

DESCRIPTION

An embodiment of the present invention is a technique to prevent reliability failures in semiconductor devices. A trench is patterned in a polyimide layer over a guard ring having a top metal layer. A passivation layer is etched at bottom of the trench. A capping layer is deposited on the trench over the etched passivation layer. The capping layer and the top metal layer form a mechanical strong interface to prevent a crack propagation.

In another embodiment of the invention, a first passivation layer is patterned over an area including a guard ring. A metal layer is deposited and etched on the patterned passivation layer on top of the guard ring. The metal layer forms a cap on top of the guard ring. A second passivation layer is deposited on the cap. A polyimide layer is deposited on the first and second passivation layers.

In yet another embodiment of the invention, a polyimide layer and a passivation layer are patterned over a top metal layer piece. The polyimide and passivation layers cover a guard ring including a top metal layer. A capping layer is deposited on the patterned polyimide and passivation layers. The capping layer and the top metal layer piece form a mechanical strong interface to hinder a crack initiation near the top metal layer piece.

In yet another embodiment of the invention, a passivation layer is patterned on top of a guard ring. A polyimide layer is deposited on the passivation layer to cover the passivation layer such that an edge of the passivation layer is not exposed.

In the following description, numerous specific details are set forth. However, it is understood that embodiments of the invention may be practiced without these specific details. In other instances, well-known circuits, structures, and techniques have not been shown to avoid obscuring the understanding of this description.

One embodiment of the invention may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a program, a procedure, a method of manufacturing or fabrication, etc.

An embodiment of the present invention is a technique to form a guard ring assembly to extend the guard ring design. There are several embodiments that provide a strong interface to prevent a crack or cracks from propagating to the surface area near the interface between the passivation layer and the top metal layer of the guard ring.

Figure 1:
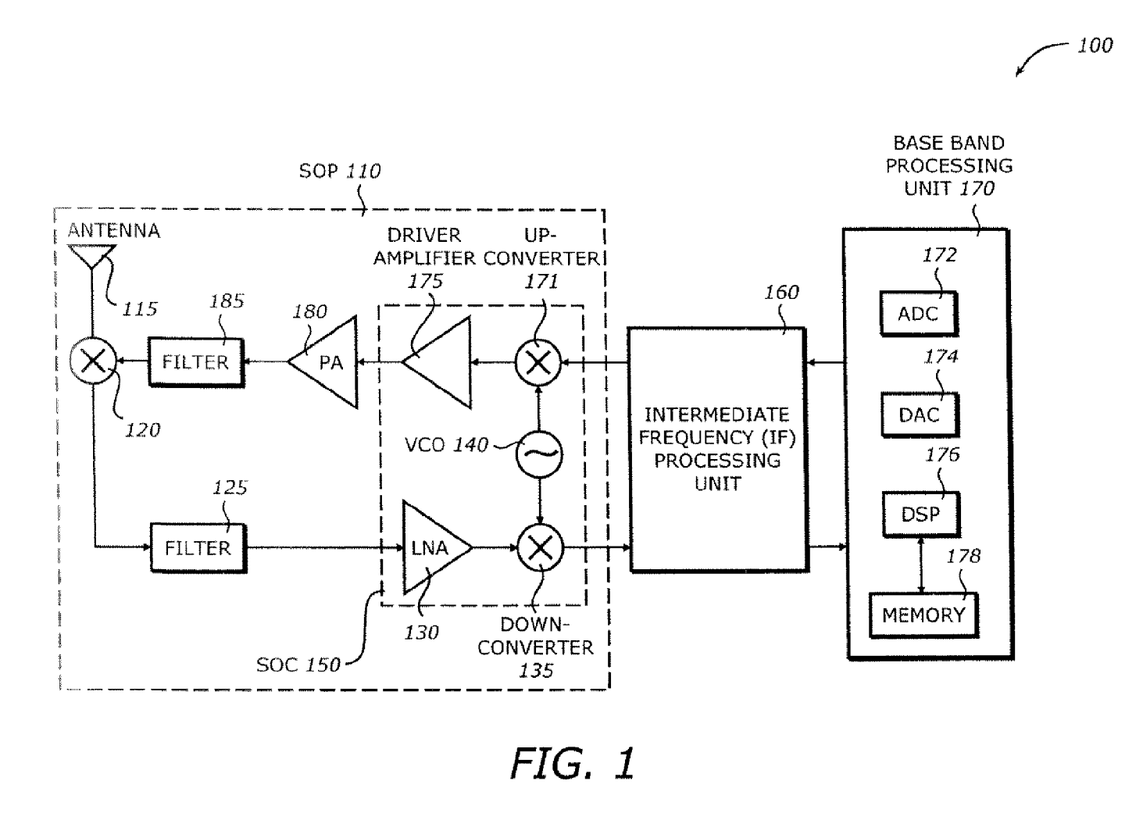
FIG. 1 is a diagram illustrating a system in which one embodiment of the invention may be practiced.

FIG. 1 is a diagram illustrating a system 100 in which one embodiment of the invention may be practiced. The system 100 represents a mobile communication module. It includes a system on package (SOP) 110, an intermediate frequency (IF) processing unit 160, and a base-band processing unit 170.

The SOP 110 represents the front end processing unit for the mobile communication module. It is a transceiver incorporating on-package integrated lumped passive components as well as radio frequency (RF) components. It includes an antenna 115, a duplexer 120, a filter 125, a system-on-chip (SOC) 150, a power amplifier (PA) 180, and a filter 185.

The antenna 115 receives and transmits RF signals. The RF signals may be converted to digital data for processing in subsequent stages. It may be designed in compact micro-strip and strip-line for L and C-band wireless applications. The duplexer 120 acts as a switch to couple the antenna 115 to the receiver and the transmitter to the antenna 115. The filters 125 and 185 may be C-band LTCC-strip-line filter or multilayer organic lumped-element filter at 5.2 GHz and narrowband performance of 200 MHz suitable for the Institute of Electrical and Electronic Engineers (IEEE) 802.11 wireless local area network (WLAN). The SOC 150 includes a low noise amplifier (LNA) 130, a down converter 135, a local voltage controlled oscillator (VCO) 140, an up converter 171, and a driver amplifier 175. The LNA 130 amplifies the received signal. The down converter 135 is a mixer to convert the RF signal to the IF band to be processed by the IF processing unit 160. The up converter 171 is a mixer to convert the IF signal to the proper RF signal for transmission. The VCO 140 generates modulation signal at appropriate frequencies for down conversion and up conversion. The driver amplifier 175 drives the PA 180. The PA 180 amplifies the transmit signal for transmission.

The IF processing unit 160 includes analog components to process IF signals for receiving and transmission. It may include a band-pass filter and a low pass filter at suitable frequency bands. The filter may provide base-band signal to the base-band processing unit 170. The base-band processing unit 170 may include an analog-to-digital converter (ADC) 172, a digital-to-analog converter (DAC) 174, a digital signal processor (DSP) 176, and a memory device 178. The ADC 172 and the DAC 174 are used to convert analog signals to digital data and digital data to analog signal, respectively. The DSP 176 is a programmable processor that may execute a program to process the digital data. The DSP 176 may be coupled to the front end processing unit via the IF processing unit 160 and/or the base-band processing unit 170 to process the digital data. The memory device 178 may contain code and/or data used by the DSP 176. The DSP 176 or the memory device 178 may be a device having a guard ring assembly to prevent crack propagation that may cause damage to the die during thermal or mechanical stresses caused by environmental conditions or testing. The DSP 176 or the memory device 178 may be implemented by any of the embodiments shown in FIGS. 2A, 2B, 3, 4A, 4B, 5A, 5B, and 5C below.

Figure 2A:
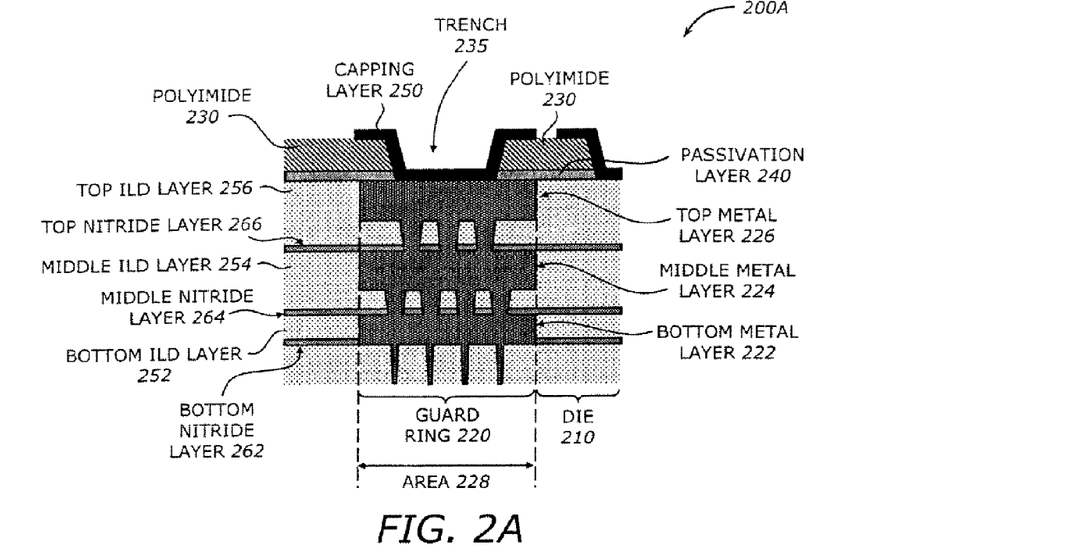
FIG. 2A is a diagram illustrating a device having a metal-capped trench within guard ring area according to one embodiment of the invention.

FIG. 2A is a diagram illustrating a device 200A having a metal-capped trench within a guard ring area according to one embodiment of the invention. The device 200A includes a die 210, a guard ring 220, a polyimide layer 230, a passivation layer 240, and a capping layer 250.

The die 210 may be a semiconductor active die that contains circuitry to perform specified functions. It may represent a processor, a memory, a chipset, or any other integrated circuit. It may include a thin die, a plurality of stacked dice, or any combination thereof.

The guard ring 220 may be a structure embedded in the layers adjacent to the die 210 to guard or protect the die 210 from being damaged by environmental stresses such as mechanical, thermal, or humidity. In one embodiment, the guard ring 220 may prevent a crack or cracks caused by thermal or mechanical actions such as the saw-induced stress during the dicing phase in the wafer fabrication process or the thermal cycling during highly accelerated tests. The guard ring 220 may include a number of metal layers. For illustrative purposes, three layers are shown: a bottom metal layer (M1) 222, a middle metal layer (M2) 224, and a top metal layer (M3) 226. It is understood that more or less number of metal layers may be employed. Typically, the guard ring occupies an area 228.

The guard ring 220 and the die 210 may be embedded in a number of interlayer dielectric (ILD) or nitride layers. For illustrative purposes, three ILD layers and three nitride layers are shown: a bottom ILD layer 252, a middle ILD layer 254, a top ILD layer 256, a bottom nitride layer 262, a middle nitride layer 264, and a top nitride layer 266.

The polyimide layer 230 may be patterned to provide a trench 235 having a bottom surface over the guard ring 220. The trench 235 may be smaller than and within the area 228. The passivation layer 240 may be etched at bottom of the trench within the area 228 of the guard ring 220. The passivation layer 240 may be made of silicon nitride ($Si_3N_4$) or nitride. The capping layer 250 is deposited on the trench 235 over the etched passivation layer 240 and covers the area 228. The capping layer 250 may be patterned or etched so that it is only on top of the guard ring 220 and the bond pads. In one embodiment, the capping layer 250 may be a metal or made of at least one of titanium (Ti) and aluminum (Al). The capping layer 250 may also be an alloy or a combination of alloys. It may also be a combination of metal layers. In other words, the capping layer 250 may include one or more metal layers, alloys, or a stack. The capping layer 250 and the top metal layer 226 of the guard ring 220 may form a mechanical strong interface to prevent a crack propagating over the top metal layer 226.

Figure 2B:
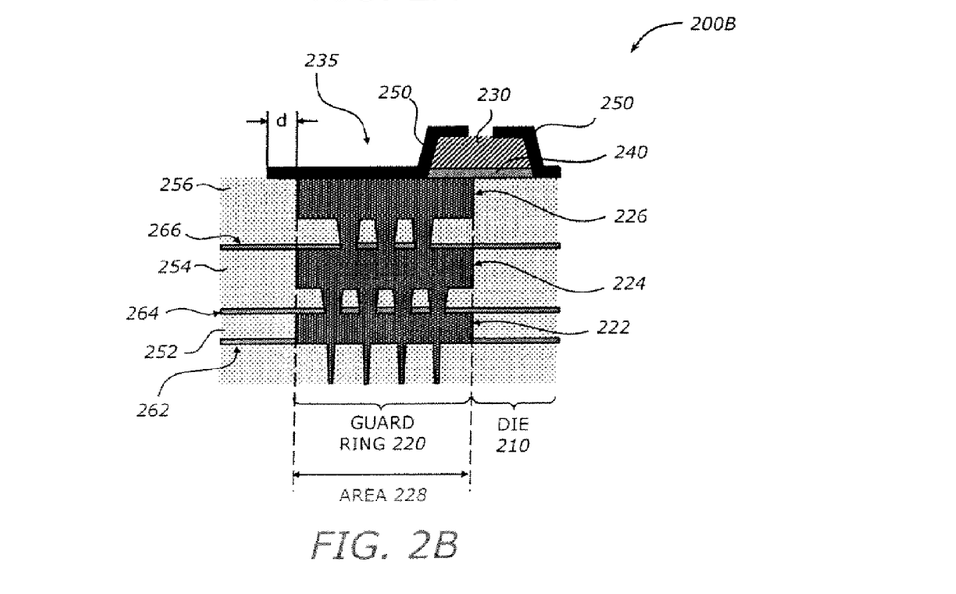
FIG. 2B is a diagram illustrating a device having a metal-capped trench extending beyond a guard ring area according to one embodiment of the invention.

FIG. 2B is a diagram illustrating a device 200B having metal-capped trench extending beyond the guard ring area according to one embodiment of the invention. The device 200B essentially has the same components as the device 200A shown in FIG. 2A.

The difference between the device 200B and the device 200A is that the bottom surface of the trench 235 may extend beyond the area 228 by a distance d at the edge that is further away from the die 210. In one embodiment, the length of the area 228 may be greater than 3 µm and the distance d may be greater than 1 µm.

Figure 3:
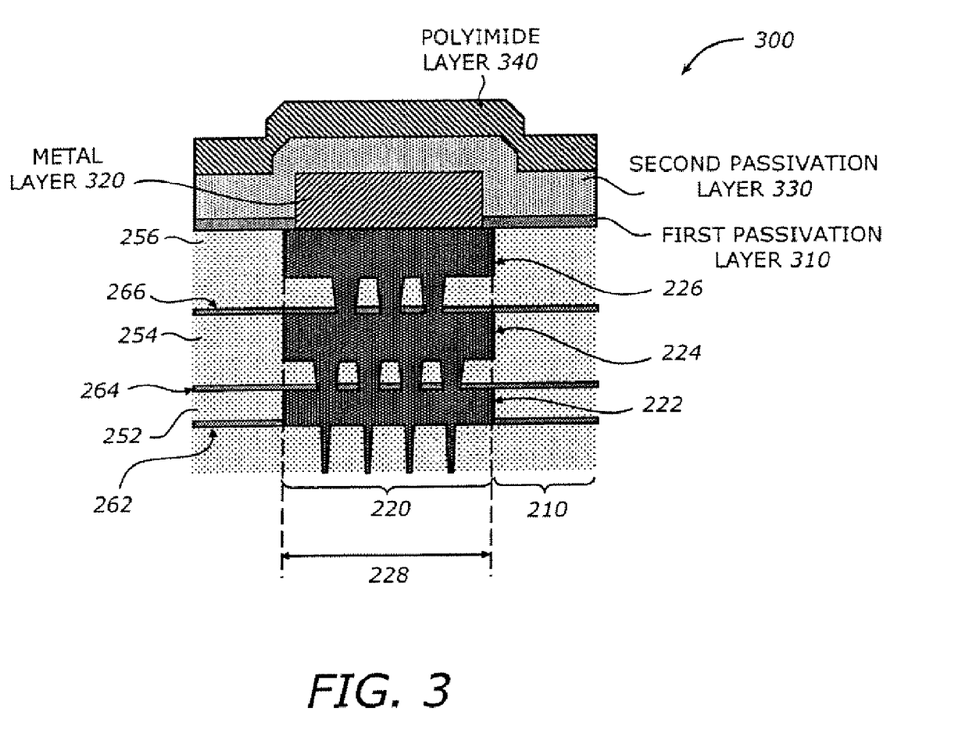
FIG. 3 is a diagram illustrating a device with a metal cap according to one embodiment of the invention.

FIG. 3 is a diagram illustrating a device 300 with a metal cap according to one embodiment of the invention. The device 300 includes the die 210, the guard ring 220, a first passivation layer 310, a metal layer 320, a second passivation layer 330, and a polyimide layer 340.

The die 210 and the guard ring 220 together with the ILD and nitride layers are similar to the same components of the device 200A shown in FIG. 2A.

The first passivation layer 310 may be patterned over the area 228 including the guard ring 220. The metal layer 320 is deposited and etched on the patterned passivation layer 310 on top of the guard ring 220. The metal layer 320 is similar to the capping layer 250 shown in FIG. 2A. In one embodiment, the metal layer 320 may be made of at least one of titanium (Ti) and aluminum (Al). The metal layer 320 may form a cap on top of the guard ring 220 and within the area 228. The second passivation layer 330 is deposited on the cap 320 and the first passivation layer 310. In one embodiment, the first and second passivation layers 310 and 330 may be nitride and oxide, respectively. The polyimide layer 340 is deposited on the second passivation layer 330.

Figure 4A:
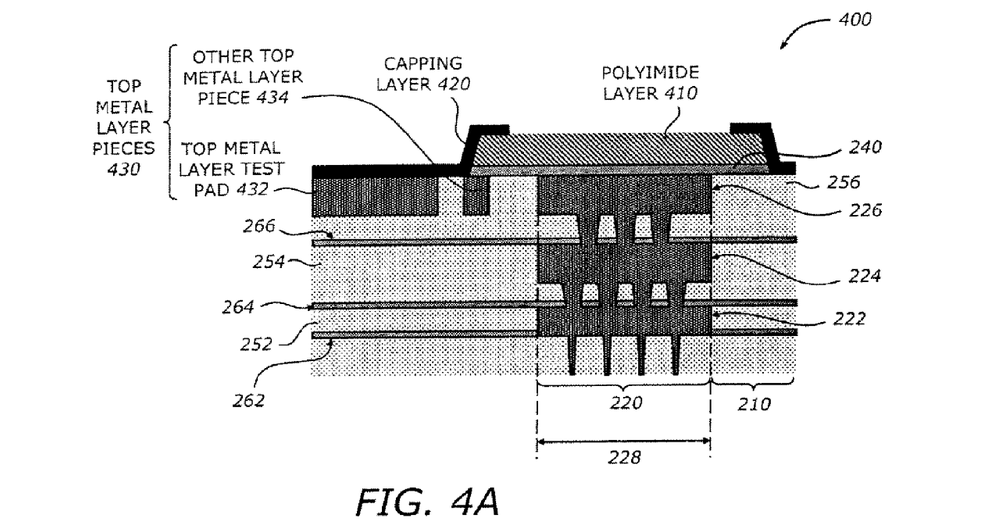
FIG. 4A is a diagram illustrating a cross sectional view of a device with top metal layer pieces according to one embodiment of the invention.

FIG. 4A is a diagram illustrating a cross sectional view of a device 400 with top metal layer pieces according to one embodiment of the invention. The device 400 includes the die 210, the guard ring 220, a polyimide layer 410, a capping layer 420, and top metal layer pieces 430.

The die 210 and the guard ring 220 together with the ILD and nitride layers are similar to the same components of the device 200A shown in FIG. 2A.

The polyimide layer 410 and the passivation layer 240 are patterned over the top metal layer pieces 430. The top metal layer pieces 430 may include a test pad 432 and other top layer metal piece 434. They are metal at the same level with the top metal layer 226 of the guard ring 220. The polyimide layer 410 and the passivation layer 240 cover the area 228 of the guard ring 220 including the top metal layer 226.

The capping layer 420 is deposited on the patterned polyimide layer 410. The capping layer 420 is similar to the capping layer 250 shown in FIG. 2A. In one embodiment, the capping layer 420 may be a metal or made of at least one of titanium (Ti) and aluminum (Al). The capping layer 420 and the top metal layer pieces 430 form a mechanical strong interface to hinder a crack initiation near the top metal layer piece. Although the interface formed by the top metal layer 226 of the guard ring 220 and the passivation layer 240 remains weak, the interface formed by the capping layer 420 and the top metal layer pieces 430 reduces any thermal or mechanical stress and prevent crack propagation over the top metal layer 226 of the guard ring 220.

Figure 4B:
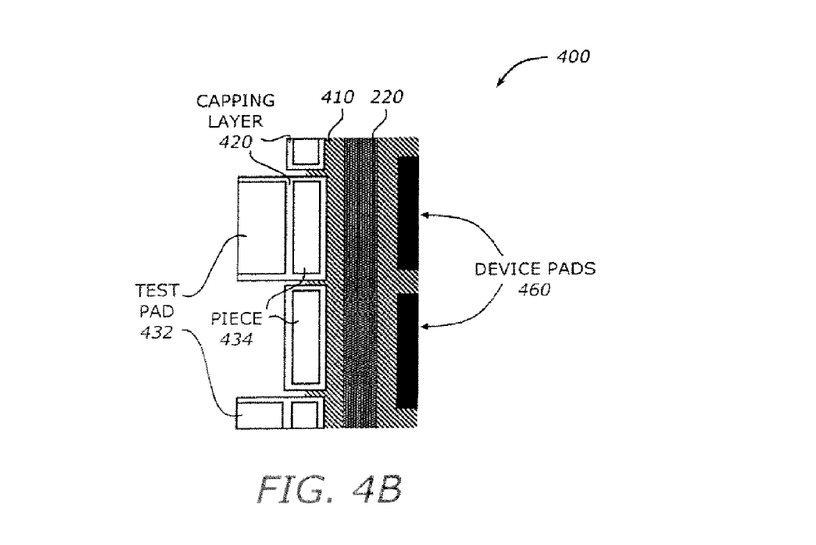
FIG. 4B is a diagram illustrating a top view of a device with top metal layer pieces according to one embodiment of the invention.

FIG. 4B is a diagram illustrating a top view of a device with top metal layer pieces according to one embodiment of the invention.

The top view shows the test pad 432 and other top metal layer piece 434 underneath the capping layer 420 on one side of the polyimide layer 410 and the passivation layer 240. Device pads 460 are shown on the other side of the polyimide layer 410 and the passivation layer 240. The guard ring 220 is shown below the passivation layer 240 and the polyimide layer 410. The other top metal layer piece 434 and capping layer 420 may be used in regions between test pads 432 to provide further protection between test pads 432. The capping layer 420 and other top metal layer piece 434 are discontinuous between test pad 432 nodes to prevent electrically shorting one test pad 432 to another, while still providing crack protection for the greatest amount of the die perimeter.

Figure 5A:
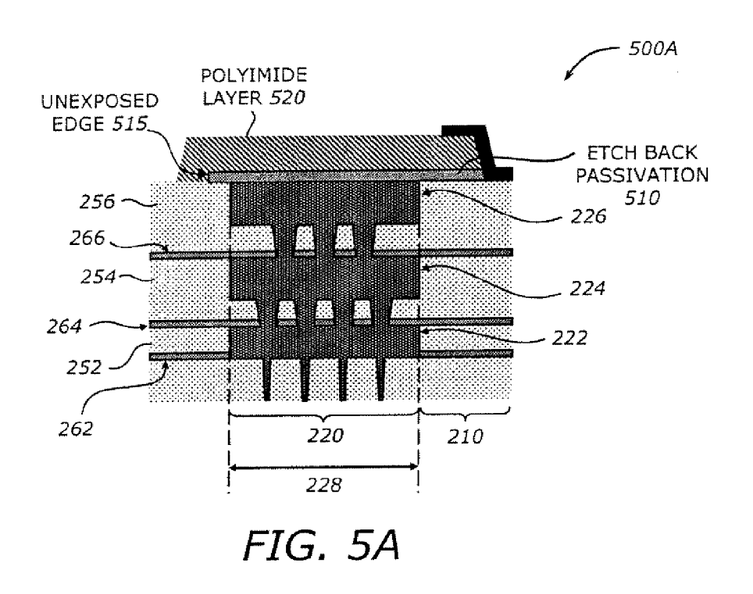
FIG. 5A is a diagram illustrating a device with an etched back passivation layer according to one embodiment of the invention.

FIG. 5A is a diagram illustrating a device 500A with an etched back passivation layer according to one embodiment of the invention. The device 500A includes the die 210, the guard ring 220, a passivation layer 510, and a polyimide layer 520.

The die 210 and the guard ring 220 together with the ILD and nitride layers are similar to the same components of the device 200A shown in FIG. 2A.

The passivation layer 510 is patterned on top of the top metal layer 226 of the guard ring 220. It is etched back while still covering beyond the area 228 of the guard ring 220. The polyimide layer 520 is deposited on the passivation layer 510 such that an end or edge 515 of the passivation layer 510 is not exposed. Alternatively, the polyimide layer 520 may be deposited to extend beyond the end or edge of the passivation layer 510. By not exposing the edge of the passivation layer 510, the crack initiation may be prevented from propagating to the top metal layer 226 of the guard ring 220.

Figure 5B:
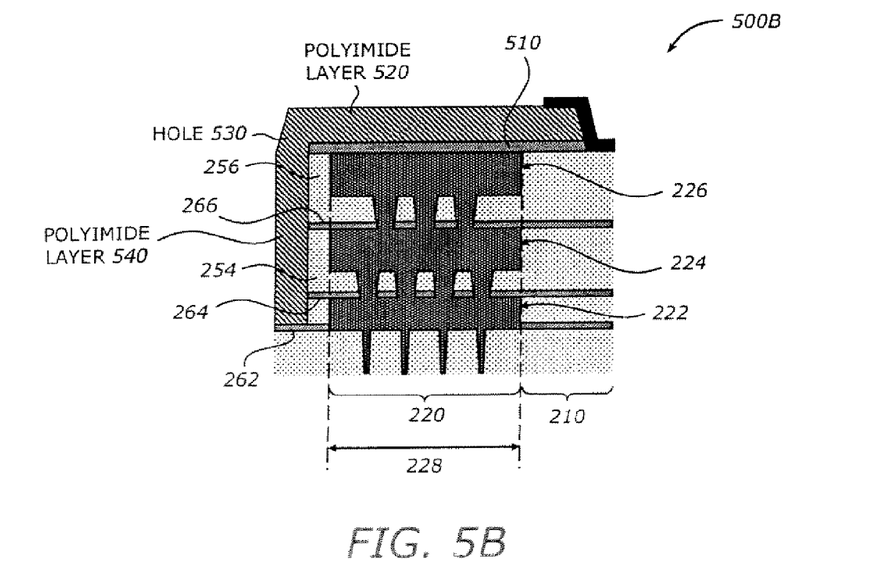
FIG. 5B is a diagram illustrating a device with a vertial polyimide-filled hole to one embodiment of the invention.

FIG. 5B is a diagram illustrating a device 500B with a vertical polyimide-filled hole according to one embodiment of the invention. The device 500B includes the die 210, the guard ring 220, a passivation layer 510, a first polyimide layer 520, a hole 530, and a second polyimide layer 540.

The die 210 and the guard ring 220 together with the ILD and nitride layers are similar to the same components of the device 200A shown in FIG. 2A. The passivation layer 510 is the same as shown in FIG. 5A. It may or may not be etched back. The first polyimide layer 520 is deposited on the passivation layer 510.

The hole or trench 530 is etched vertically through at least an interlayer dielectric (ILD) layer and/or a nitride layer. For illustrative purposes, the hole 530 is shown to be etched through the ILD layers 256 and 254 and the nitride layers 266 and 264. The nitride layer 262 serves as the bottom of the hole 530. The second polyimide layer 540 is filled in the hole 530. It is merged with the first polyimide layer 520 to form a polyimide wall covering the guard ring 220. This polyimide wall provides an interface to hinder any crack propagation.

Figure 5C:
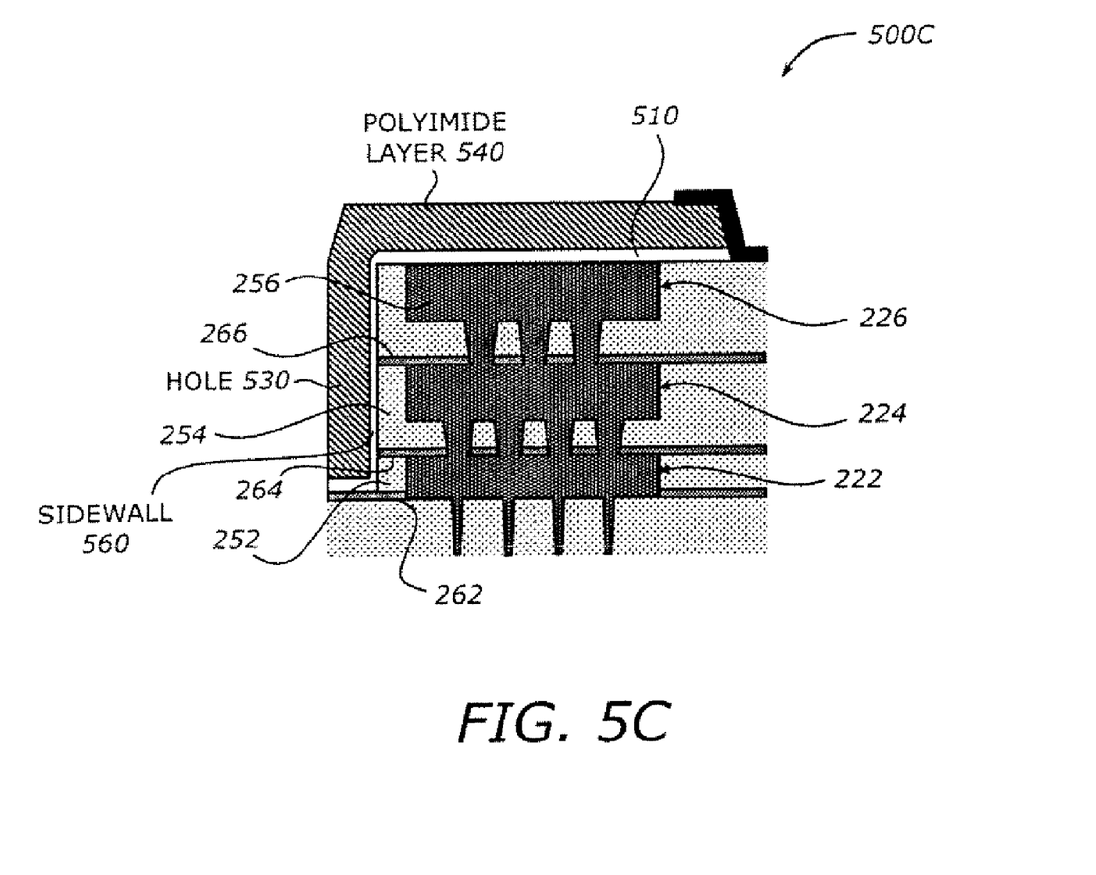
FIG. 5C is a diagram illustrating a device with a vertical polyimide-filled hole and a sidewall according to one embodiment of the invention.

FIG. 5C is a diagram illustrating a device 500C with a vertical polyimide-filled hole and a sidewall according to one embodiment of the invention. The device 500C includes the die 210, the guard ring 220, a passivation layer 510, a first polyimide layer 520, a hole 530, a second polyimide layer 540, and a sidewall 560

The die 210 and the guard ring 220 together with the ILD and nitride layers are similar to the same components of the device 200A shown in FIG. 2A. The passivation layer 510, the first polyimide layer 520, the hole 530, and the second polyimide layer 540 are similar to the same components shown in FIG. 5B.

The sidewall 560 may be formed after the hole 530 is created and prior to depositing the second polyimide layer 540 into the hole 530. The sidewall 560 may be made by nitride, or any other suitable material. It is deposited on a vertical wall of the hole 530. The second polyimide layer 540 is deposited over the sidewall 560.

The embodiments shown in FIGS. 4A, 4B, 5A, 5B, and 5C break up the inherent planarity of the interconnect stack formed by a typical dual damascene process. Since integrated circuits with copper back ends are susceptible to interface delamination and/or crack propagation facilitated by this planarity, breaking up the planarity leads to a stronger interface and a better prevention of crack propagation.

Figure 6:
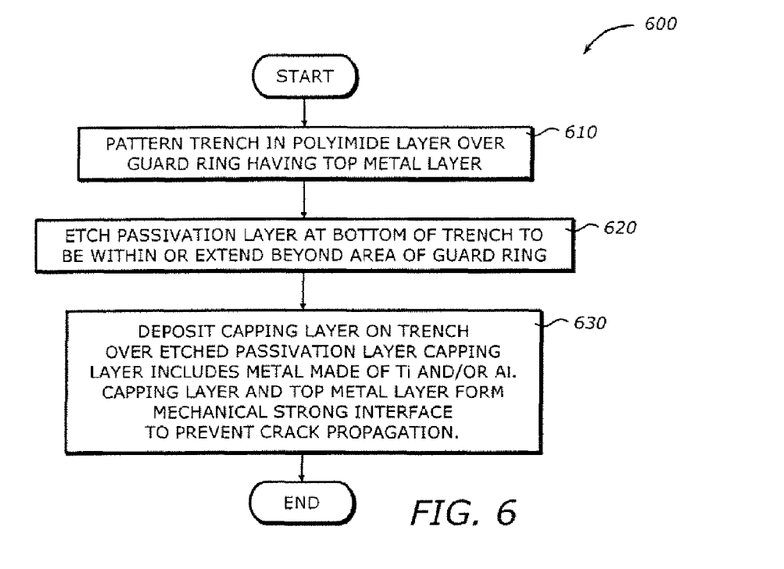
FIG. 6 is a flowchart illustrating a process to fabricate a device having metal-capped trench according to one embodiment of the invention.

FIG. 6 is a flowchart illustrating a process 600 to fabricate a device having metal-capped trench according to one embodiment of the invention.

Upon START, the process 600 patterns a trench in a polyimide layer over a guard ring having a top metal layer (Block 610). Next, the process 600 etches a passivation layer at bottom of the trench (Block 620). The etching of the passivation layer at the bottom of the trench may be within or extend beyond an area of the guard ring.

Then, the process 600 deposits a capping layer on the trench over the etched passivation layer (Block 630) and is then terminated. The capping layer may be a metal or made of at least one of titanium (Ti) and aluminum (Al). The capping layer may also be an alloy or a combination of alloys. It may also be a combination of metal layers. In other words, the capping layer may include one or more metal layers, alloys, or a stack. The capping layer and the top metal layer form a mechanical strong interface to prevent a crack propagation, such as crack propagation over the top metal layer.

Figure 7:
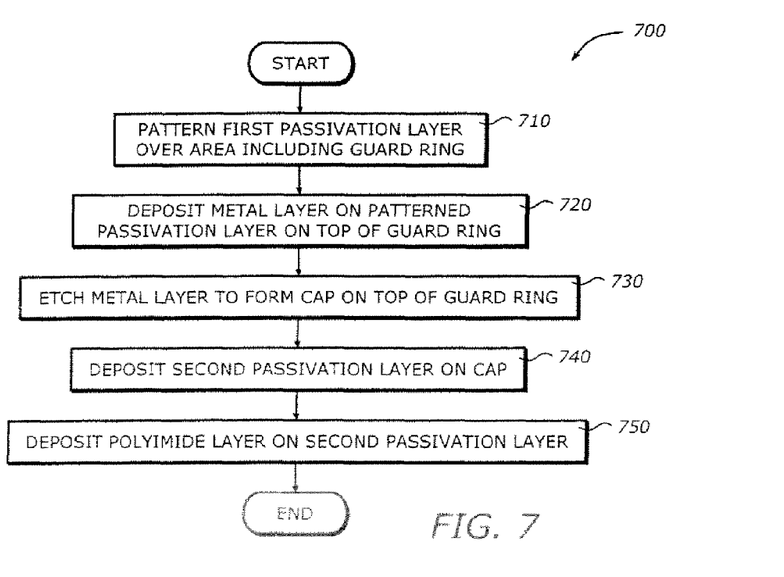
FIG. 7 is a flowchart illustrating a process to fabricate a device with a metal cap according to one embodiment of the invention.

FIG. 7 is a flowchart illustrating a process 700 to fabricate a device with a metal cap according to one embodiment of the invention.

Upon START, the process 700 patterns a first passivation layer over an area including a guard ring (Block 710). In one embodiment the first passivation layer may include nitride.

Next, the process 700 deposits a metal layer on the patterned passivation layer on top of the guard ring (Block 720). The metal layer may be similar to the capping layer in FIG. 6.

Then, the process 700 etches the metal layer to form a cap on top of the guard ring (Block 730). In one embodiment the metal cap may be made of at least one of titanium (Ti) and aluminum (Al). Next, the process 700 deposits a second passivation layer on the cap (Block 740). Then, the process 700 deposits a polyimide layer on the second passivation layer (Block 750).

Figure 8:
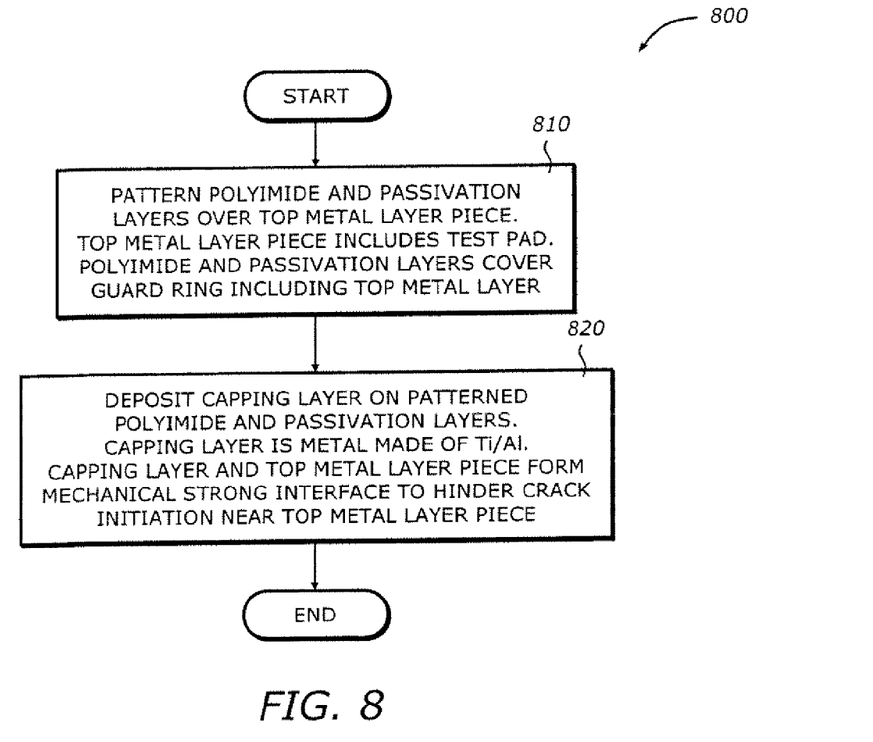
FIG. 8 is a flowchart illustrating a process to fabricate a device with top metal layer pieces according to one embodiment of the invention.

FIG. 8 is a flowchart illustrating a process 800 to fabricate a device with top metal layer pieces according to one embodiment of the invention.

Upon START, the process 800 patterns a polyimide and passivation layers over a top metal layer piece (Block 810). The top metal layer piece may be a test pad or any other element at the top metal layer. The polyimide and passivation layers cover a guard ring having a top metal layer. Next, the process 800 deposits a capping layer on the patterned polyimide and passivation layers (Block 820). The capping layer may be similar to the capping layer in FIG. 6. In one embodiment, the capping layer may be a metal or made of at least one of titanium (Ti) and aluminum (Al). The capping layer and the top metal layer piece form a mechanical strong interface to hinder a crack initiation near the top metal layer piece.

Figure 9:
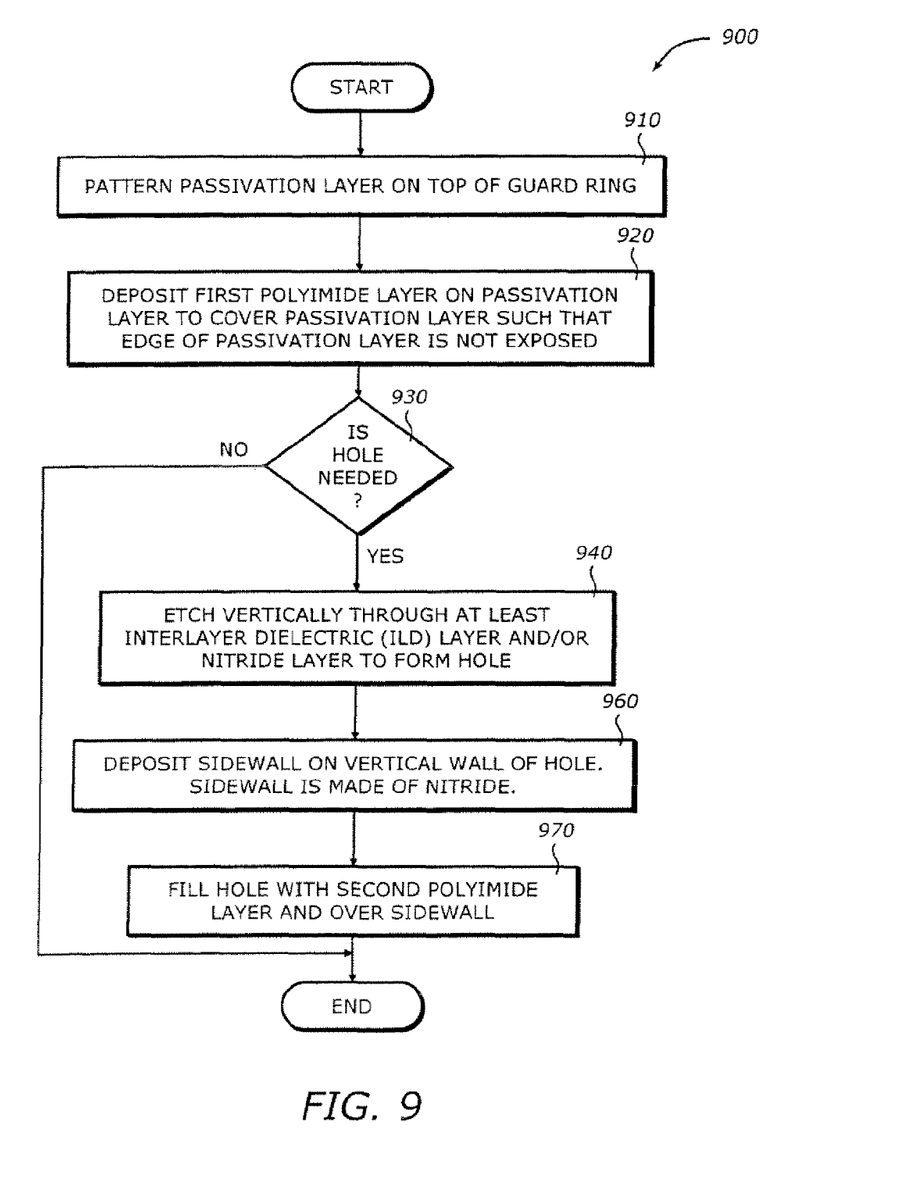
FIG. 9 is a flowchart illustrating a process to fabricate a device with an unexposed passivation layer according to one embodiment of the invention.

FIG. 9 is a flowchart illustrating a process 900 to fabricate a device with an unexposed passivation layer according to one embodiment of the invention.

Upon START, the process 900 patterns a passivation layer on top of a guard ring (Block 910). Next, the process 900 deposits a first polyimide layer on the passivation layer to cover the passivation layer such that an edge of the passivation layer is not exposed (Block 920). Next, the process 900 determined if a hole is necessary (Block 930). If not, the process 900 is terminated. Otherwise, the process 900 etches vertically through at least an interlayer dielectric (ILD) layer and/or a nitride layer to form a hole (Block 940).

Then, the process 900 deposits a sidewall on a vertical wall within the hole (Block 960). In one embodiment, the sidewall is made of nitride. Next, the process 900 fills the hole with a second polyimide layer and over the sidewall (Block 970) and is then terminated.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. A semiconductor apparatus, comprising:
   an active die region;
   a guard ring having a plurality of stacked metal layers, the plurality of stacked metal layers including a top metal layer, the guard ring having an inner boundary closer to the active die region and an outer boundary further from the active die region;
   a first dielectric layer having a top boundary and a bottom boundary, at least some of the top metal layer being between the top and bottom boundaries of the first dielectric layer;
   a passivation layer over at least a portion of the top metal layer and at least a portion of the first dielectric layer; and
   a metal capping layer over the top metal layer, the metal capping layer comprising:
      a first portion proximate to the outer boundary of the guard ring and in direct contact with the first dielectric layer,
      a second portion proximate to the outer boundary and in direct contact with the top metal layer, and
      a third portion proximate to the inner boundary of the guard ring and separated from the top metal layer by the passivation layer.

2. The apparatus of claim 1, wherein the metal capping layer comprises titanium.

3. The apparatus of claim 1, wherein the metal capping layer is covered by a layer of insulating material.

4. The apparatus of claim 1, further comprising at least one test pad outside the outer boundary of the guard ring.

\* \* \* \* \*